United States Patent
Song et al.

(10) Patent No.: US 7,153,739 B2
(45) Date of Patent: Dec. 26, 2006

(54) METHOD FOR MANUFACTURING A CAPACITOR OF A SEMICONDUCTOR DEVICE

(75) Inventors: Chang Rock Song, Gyeonggi-do (KR); Sang Ho Woo, Gyeonggi-do (KR); Dong Su Park, Gyeonggi-do (KR); Cheol Hwan Park, Seoul (KR); Tae Hyeok Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 234 days.

(21) Appl. No.: 10/721,092

(22) Filed: Nov. 26, 2003

(65) Prior Publication Data

US 2004/0161890 A1 Aug. 19, 2004

(30) Foreign Application Priority Data

Feb. 17, 2003 (KR) .............. 10-2003-0009756

(51) Int. Cl.
*H01L 21/8242* (2006.01)

(52) U.S. Cl. .................. 438/253; 438/396

(58) Field of Classification Search ......... 438/239–242, 438/250–256, 393–399; 257/306–311
See application file for complete search history.

(56) References Cited

U.S. PATENT DOCUMENTS

| | | | | |
|---|---|---|---|---|
| 6,489,649 B1 * | 12/2002 | Kobayashi et al. | ......... | 257/314 |
| 6,528,364 B1 * | 3/2003 | Thakur | ............. | 438/239 |
| 6,576,526 B1 * | 6/2003 | Kai et al. | ............ | 438/393 |
| 2002/0022335 A1 * | 2/2002 | Chen | .............. | 438/396 |
| 2003/0160274 A1 * | 8/2003 | Das et al. | ........... | 257/306 |

FOREIGN PATENT DOCUMENTS

KR  10-1996-074980   12/1996

* cited by examiner

*Primary Examiner*—Jennifer M. Kennedy
(74) *Attorney, Agent, or Firm*—Heller Ehrman LLP

(57) ABSTRACT

The present invention discloses methods for manufacturing a capacitor of a semiconductor device employing doped silicon film as an electrode and an oxide film-nitride film-oxide film as a dielectric film. An interlayer insulating film is formed on a semiconductor substrate. A storage electrode is formed consisting of a doped polysilicon on the interlayer insulating film. A first oxide film is formed on the storage electrode that is subjected to a thermal treatment in an atmosphere containing an n-type impurity to implant the impurity into the first oxide film. A nitride film is formed on the first oxide film, whereby the impurity in the first oxide film is diffused into the nitride film. A second oxide film is formed on the nitride film. A plate electrode is then formed on the second oxide film.

11 Claims, 2 Drawing Sheets

METHOD FOR MANUFACTURING A CAPACITOR OF A SEMICONDUCTOR DEVICE

BACKGROUND OF THE INVENTION

1. Field of the Invention

The present invention relates to a method for manufacturing a capacitor of a semiconductor device, and in particular to an improved method for manufacturing a capacitor employing doped silicon film as an electrode and oxide film-nitride film-oxide film (hereinafter referred to as "ONO film") as a dielectric film, wherein the thickness of the nitride film in the ONO film can be effectively reduced and a characteristic of the breakdown voltage due to leakage current can be improved.

2. Description of the Background Art

Generally, a capacitor in a DRAM memory cell functions as a storage for electric charge to store information. Therefore, the capacitor requires sufficient capacitance and high reliability in long term repeated use, and the dielectric film must exhibit good insulation properties so there is low leakage current.

As the integration density of devices increases, the area allocated to a unit cell is reduced, resulting in difficulties in obtaining sufficient capacitance in a capacitor. Therefore, in order to increase the capacitance of a capacitor, the height of the capacitor must be increased and the process margin between adjacent cells must be reduced.

The capacitors in a DRAM cell must have a capacitance of at least 25 fF. Since the capacitance of a capacitor is proportional to the area of the surface of the storage electrode and inversely proportional to the thickness of a dielectric film, methods for increasing the area of the capacitor or decreasing the thickness of the dielectric film have been proposed.

An oxide film having a dielectric constant of 3.8 was used as a dielectric film early in the development of capacitors in semiconductor devices. Subsequently, a nitride film having a dielectric constant of 7 was used. Presently, novel dielectric materials such as $Ta_2O_5$, $Al_2O_3$ and $HfO_2$ are used in devices having capacity of more than 256 Mbits.

As for the capacitor structure, a stack structure was employed in early devices. However, a cylinder type or concave type capacitor, having a MPS (meta-stable polysilicon) for increasing the area of the storage electrode by 1.7~2 times, is currently used because the use of a stack structure became difficult due to high integration density.

Although not shown in the figures, a conventional method for manufacturing a capacitor of semiconductor device using doped silicon as electrode is as follows.

An interlayer insulating film having a contact plug for a storage electrode therein is formed on a semiconductor substrate. Next, a storage electrode is formed on the interlayer insulating film. A natural oxide film on the storage electrode is then cleaned using a solution containing HF. A first oxide film is then formed on the storage electrode in an $O_2$, $H_2O$ or $O_2$ atmosphere. The first insulating film may be formed by performing a wet oxidation process using a mixture solution of $NH_4OH$ and $H_2O_2$.

Thereafter, a nitride film is formed on the first insulating film and the nitride film is then oxidized in a $H_2O$ atmosphere to form a second oxide film therein. Next, a plate electrode is formed on the second oxide film using doped polysilicon.

In accordance with the conventional method for manufacturing a capacitor of a semiconductor device, the natural oxide film on the storage electrode is cleaned using a solution containing HF. The solution containing HF not only removes the natural oxide film, but also removes dopants in the storage electrode consisting of doped polysilicon, thereby causing charge depletion. Moreover, when the thickness of the nitride film is reduced to increase permittivity of the dielectric layer, the breakdown voltage of the dielectric layer is drastically reduced.

The problem of charge depletion appears more severely in cylinder type capacitors because the surface of the storage electrode is additionally exposed to an etching solution during the process for removing a sacrificial oxide film.

SUMMARY OF THE INVENTION

Accordingly, it is an object of the present invention to provide a method for manufacturing a capacitor of a semiconductor device wherein an additional thermal treatment process is performed for compensating dopants lost in the the natural oxide film removal process on the storage electrode to prevent the charge depletion phenomenon of the storage electrode and to allow a reduction of the thickness of the nitride film without degrading breakdown voltage characteristics.

In order to achieve the above-described object of the invention, there is provided a method for manufacturing a capacitor of a semiconductor device having a dielectric film of an ONO structure, comprising the steps of forming an interlayer insulating film on a semiconductor substrate; forming a storage electrode consisting of a doped polysilicon on the interlayer insulating film; forming a first oxide film on the storage electrode; subjecting the first oxide film to a thermal treatment in an atmosphere of gas containing an n-type impurity to implant the impurity into the first oxide film; forming a nitride film on the first oxide film, whereby the impurity in the first oxide film is diffused into the nitride film; forming a second oxide film on the nitride film; and forming a plate electrode on the second oxide film.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for manufacturing a capacitor of a semiconductor device in accordance with a preferred embodiment of the present invention will now be described in detail with reference to the accompanying drawings.

FIGS. 1 through 4 are cross-sectional diagrams illustrating methods for manufacturing a capacitor of a semiconductor device in accordance with the present invention.

Figure 1:
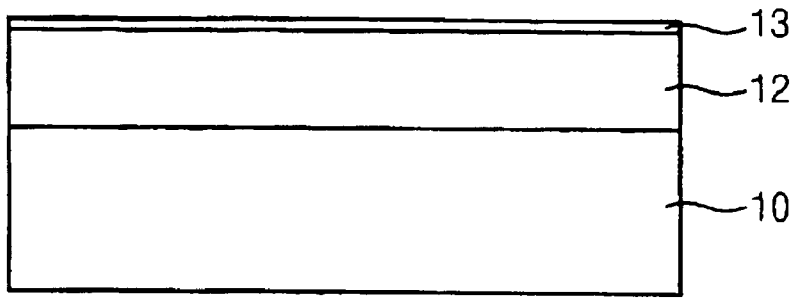
FIGS. 1 through 4 are cross-sectional diagrams illustrating methods for manufacturing a capacitor of a semiconductor device in accordance with the present invention.

Referring to FIG. 1, a lower structure, such as a device isolation film (not shown) and MOSFET (not shown), are formed on a semiconductor substrate (not shown), for example a silicon wafer. Thereafter, an interlayer insulating film 10 having a contact plug (not shown) for a storage electrode contacting a predetermined region of the semiconductor substrate is formed on the semiconductor substrate.

Next, a storage electrode 12 is formed on the interlayer insulating film 10. The storage electrode 12 consists of doped silicon, preferably doped with n-type impurities such as P or As having a concentration ranging from approximately 1E20– to approximately $5E21/cm^3$. A removal process of a natural oxide film 13 on the storage electrode 12 may be performed using a solution containing HF.

Figure 2:
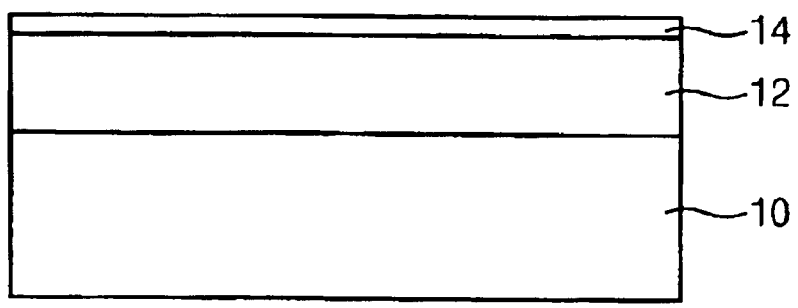

Now referring to FIG. 2, a first oxide film 14, preferably having a thickness ranging from approximately 5– to approximately 25 Å, is deposited on the storage electrode 12. The first oxide film 14 may be formed via a wet oxidation process by dipping the semiconductor substrate in a mixture solution of $NH_4OH$ and $H_2O_2$ having a temperature ranging from room temperature to approximately 80° C. for 1 to 10 minutes, approximately. In another embodiment, the first oxide film 14 may be formed via a dry oxidation process by subjecting the semiconductor substrate to a thermal treatment in a gas atmosphere containing oxygen selected from the group consisting of $O_2$, $H_2O$, $N_2O$, NO, $O_3$ and combinations thereof at a temperature ranging from 500–800° C. under a pressure ranging from approximately 0.05 to approximately 760 Torr for approximately 3 to approximately 120 minutes. Ar gas may also be used with the gas atmosphere containing oxygen.

Thereafter, the first insulating film 14 is subjected to a thermal treatment in a gas atmosphere containing an n-type impurity having a valence higher than silicon. The thermal treatment is preferably performed at a temperature ranging from approximately 500-to approximately 800° C. and under a pressure ranging from approximately 0.05 to approximately 760 Torr in a gas atmosphere containing an n-type impurity, for example $PH_3$, $AsH_3$ or combinations thereof, for approximately 3 to approximately 180 minutes. Ar gas may also be used with the gas atmosphere containing n-type atmosphere. The first oxide film 14 is converted into a material containing an impurity, for example PSG when $PH_3$ is used.

Figure 3:
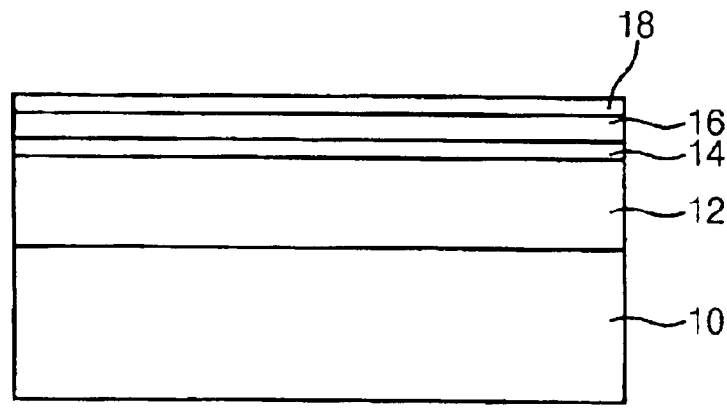

Referring to FIG. 3, a nitride film 16, preferably having a thickness ranging from approximately 30-to approximately 60 Å, is formed on the first oxide film 14. The nitride film 16 is preferably formed via a Chemical Vapor Deposition ("CVD") method in a mixed gas atmosphere of $SiH_4$ and $NH_3$ or a mixed gas atmosphere of $SiH_2Cl_2$ and $NH_3$ at a temperature higher than that of the thermal treatment of the first oxide film 14, for example approximately 600–to approximately 800° C., and under a pressure ranging from to approximately 0.05 to approximately 2 Torr. In an another embodiment, the nitride film 16 is preferably formed by nitriding the first oxide film 14 in a gas atmosphere of $NH_3$ or a mixed gas atmosphere of $NH_3$ and Ar or $NH_3$ and $N_2$ at a temperature higher than that of the thermal treatment of the first oxide film 14, for example approximately 600–to approximately 800° C., and under a pressure ranging from approximately 0.05 to approximately 760 Torr.

The CVD method and nitriding method can be used in combination. Since the formation of the nitride film 16 is carried out at relatively high temperature, the impurities contained in the first oxide film 14 diffuse into the interface of the first oxide film 14 and the storage electrode 12 to remove the charge depletion region.

Still referring to FIG. 3, a second oxide film is formed on the nitride film 16. The second oxide film is formed by performing a thermal process in an atmosphere of gas containing oxygen, for example $O_2$, $H_2O$, $N_2O$, NO, $O_3$ or combinations thereof, at a temperature ranging from approximately 650–to approximately 800° C. and under a pressure ranging from approximately 0.05 to approximately 760 Torr for approximately 3 to approximately 120 minutes. The second oxide film 18 preferably has a thickness ranging from approximately 50–to approximately 500 Å.

Figure 4:
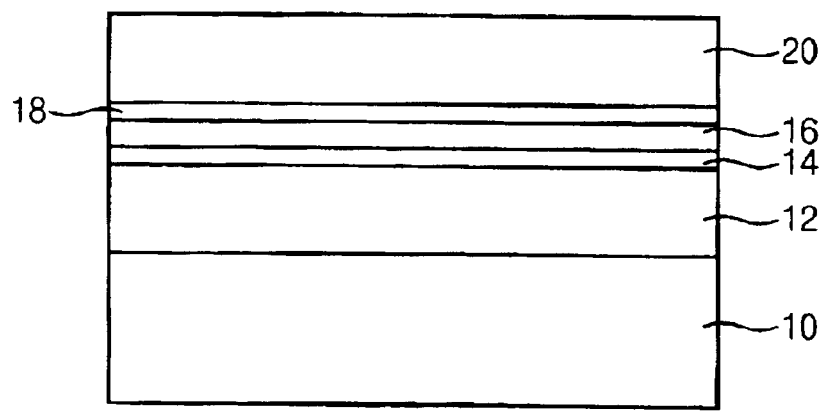

Referring to FIG. 4, a plate electrode 20, preferably consisting of doped polysilicon, is formed on the second oxide film 18.

As discussed earlier, in accordance with an embodiment of the present invention, the oxide film in the ONO film is doped with an impurity via thermal treatment and the impurity is diffused into the interface of oxide film and the polysilicon storage electrode in the subsequent nitride film formation process to remove charge the depletion region and to increase the breakdown voltage, thereby increasing the capacitance and improving reliability of the device.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing a capacitor of a semiconductor device having a dielectric film of an ONO structure, the method comprising the steps of:

forming an interlayer insulating film on a semiconductor substrate;

forming a storage electrode comprising a doped polysilicon on the interlayer insulating film;

forming a first oxide film on the storage electrode;

subjecting the first oxide film to a thermal treatment in an atmosphere comprising an n-type impurity to implant the impurity into the first oxide film;

forming a nitride film on the first oxide film, whereby the impurity in the first oxide film is diffused into the interface of the first oxide film and the storage electrode;

forming a second oxide film on the nitride film; and forming a plate electrode on the second oxide film.

2. The method according to claim 1, wherein the doped polysilicon is doped with an n-type impurity having a concentration of 1E20 to $5E21/cm^3$.

3. The method according to claim 1, wherein the step of forming the storage electrode further comprises removing a natural oxide film on the storage electrode.

4. The method according to claim 1, wherein the first oxide layer has a thickness ranging from 5 to 25 Å.

5. The method according to claim 1, wherein the step of forming the first oxide film comprises a wet oxidation process wherein the semiconductor substrate is dipped in a solution comprising $NH_4OH$ and $H_2O_2$ having a temperature ranging from room temperature to 80° C. for 1 to 10 minutes.

6. The method according to claim 1, wherein the step of forming the first oxide film comprises a dry oxidation process wherein the semiconductor substrate is subjected to a thermal treatment in an atmosphere containing oxygen selected from the group of $O_2$, $H_2O$, $N_2O$, NO, $O_3$ and combinations thereof at a temperature ranging from 500 to 800° C. under a pressure ranging from 0.05 to 760 Torr for 3 to 120 minutes.

7. The method according to claim 1, wherein the gas containing an n-type impurity is selected from the group consisting of $PH_3$, $AsH_3$ and combinations thereof, and the thermal treatment is performed at a temperature ranging from 500 to 800° C. under a pressure ranging from 0.05 to 760 Torr for 3 to 180 minutes.

8. The method according to claim 7, wherein the gas containing an n-type impurity further comprises an inert gas.

9. The method according to claim 1, wherein the nitride film has a thickness ranging from 30 to 60 Å.

10. The method according to claim 1, wherein the step of forming the nitride film is a process selected from the group of: (a) a CVD method performed in a mixed gas atmosphere comprising $SiH_4$ and $NH_3$ or a mixed gas atmosphere comprising $SiH_2Cl_2$ and $NH_3$ at a temperature ranging from 600 to 800° C. under a pressure ranging from 0.05 to 2 Torr; (b) nitriding the first oxide film in a gas atmosphere of $NH_3$, a mixed gas atmosphere of $NH_3$ and Ar or a mixed gas atmosphere of $NH_3$ and $N_2$ at a temperature ranging from 600 to 800° C. under a pressure ranging from 0.05 to 760 Torr; and (c) combinations thereof.

11. The method according to claim 1, wherein the step of forming the second oxide film comprises a thermal process performed in an atmosphere containing oxygen at a temperature ranging from 650 to 800° C. under a pressure ranging from 0.05 to 760 Torr for 3 to 120 minutes.

* * * * *